(12) United States Patent
Peng et al.

(10) Patent No.: US 7,482,059 B2
(45) Date of Patent: *Jan. 27, 2009

(54) SEMICONDUCTOR NANOCRYSTAL COMPLEXES COMPRISING A METAL COATING AND METHODS OF MAKING SAME

(75) Inventors: Adam Peng, Guilderland, NY (US); Wei Liu, Guilderland, NY (US)

(73) Assignee: Evident Technologies, Troy, NY (US)

( * ) Notice: Subject to any disclaimer, the term of this patent is extended or adjusted under 35 U.S.C. 154(b) by 392 days.

This patent is subject to a terminal disclaimer.

(21) Appl. No.: 11/125,120

(22) Filed: May 10, 2005

(65) Prior Publication Data

US 2006/0014040 A1    Jan. 19, 2006

Related U.S. Application Data

(60) Provisional application No. 60/569,452, filed on May 10, 2004.

(51) Int. Cl.
*B32B 5/16* (2006.01)
*B05D 7/00* (2006.01)
(52) U.S. Cl. ............... 428/403; 427/215; 427/217; 977/773; 977/774; 977/813
(58) Field of Classification Search ............ 428/403; 977/773, 774, 831; 427/212, 215, 217
See application file for complete search history.

(56) References Cited

U.S. PATENT DOCUMENTS 5,525,377 A * 6/1996 Gallagher et al. ......... 427/512
5,763,085 A * 6/1998 Atarashi et al. .......... 428/403
6,048,616 A * 4/2000 Gallagher et al. ........ 428/407
6,322,901 B1 * 11/2001 Bawendi et al. .......... 428/548
6,344,272 B1 * 2/2002 Oldenburg et al. ....... 428/403
6,835,455 B2 * 12/2004 Tanaka et al. ........... 428/403
7,068,898 B2 * 6/2006 Buretea et al. ........... 385/123
7,144,627 B2 * 12/2006 Halas et al. ............. 428/403
7,399,429 B2 * 7/2008 Liu et al. ............. 252/301.4 R

OTHER PUBLICATIONS

Lin and Chen, "Carrier transfer induced photoluminescence change in metal-semiconductor core-shell nanostrcutures", Applied Physics Letters 88, 161911 (2006).*

* cited by examiner

*Primary Examiner*—H. (Holly) T. Le
(74) *Attorney, Agent, or Firm*—Kenyon & Kenyon LLP

(57) ABSTRACT

A semiconductor nanocrystal complex including a metal layer formed on the outer surface of a semiconductor nanocrystal core after synthesis of the semiconductor nanocrystal core and a method for preparing a nanocrystal complex comprising forming a metal layer on a semiconductor nanocrystal core after synthesis of the semiconductor nanocrystal core. The metal layer may passivate the surface of the semiconductor nanocrystal core and protect the semiconductor nanocrystal core from the effects of oxidation. Also provided is a semiconductor nanocrystal complex with a shell grown onto the metal layer formed on the semiconductor nanocrystal core. In this embodiment, the metal layer may prevent lattice mismatch between the semiconductor shell and the semiconductor nanocrystal core.

24 Claims, 3 Drawing Sheets

SEMICONDUCTOR NANOCRYSTAL COMPLEXES COMPRISING A METAL COATING AND METHODS OF MAKING SAME

CROSS-REFERENCE TO RELATED APPLICATIONS

The present application claims priority to U.S. Provisional Application No. 60/569,452, filed May 10, 2004, which is incorporated by reference herein.

FIELD OF THE INVENTION

The present invention relates to semiconductor nanocrystal complexes and particularly to semiconductor nanocrystal complexes having a metal layer formed on a semiconductor nanocrystal core. The present invention also relates to methods of making such semiconductor nanocrystal complexes.

BACKGROUND OF THE INVENTION

Semiconductor nanocrystals are typically tiny crystals of II-VI, III-V, IV-VI materials that have a diameter between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, the narrower the full-width half max (FWHM) of the resultant photoluminescent spectra. In 1991, Brus wrote a paper reviewing the theoretical and experimental research conducted on colloidally grown semiconductor nanocrystals, such as cadmium selenide (CdSe) in particular. Brus L., *Quantum Crystallites and Nonlinear Optics, Applied Physics A*, 53 (1991)). That research, precipitated in the early 1980's by the likes of Efros, Ekimov, and Brus himself, greatly accelerated by the end of the 1980's as demonstrated by the increase in the number of papers concerning colloidally grown semiconductor nanocrystals.

Quantum yield (i.e. the percent of absorbed photons that are reemitted as photons) is influenced largely by the surface quality of the nanocrystal. Photoexcited charge carriers will emit light upon direct recombination but will give up the excitation energy as heat if photon or defect mediated recombination paths are prevalent. Because the nanocrystal may have a large surface area to volume ratio, dislocations present on the surface or adsorbed surface molecules having a significant potential difference from the nanocrystal itself will tend to trap excited state carriers and prevent radiative recombination and thus reduce quantum yield. It has been shown that quantum yield can be increased by removing surface defects and separating adsorbed surface molecules from the nanocrystal by adding a shell of a semiconductor with a wider bulk bandgap than that of the core semiconductor.

Inorganic colloids have been studied for over a century ever since Michael Faraday's production of gold sols in 1857. Rossetti and Brus began work on semiconductor colloids in 1982 by preparing and studying the luminescent properties of colloids consisting of II-VI semiconductors, namely cadmium sulfide (CdS). (Rossetti, R.; Brus L., *Electron-Hole Recombination Emission as a Probe of Surface Chemistry in Aqueous CdS Colloids, J. Phys. Chem.*, 86, 172 (1982)). In that paper, they describe the preparation and resultant optical properties of CdS colloids, where the mean diameter of the suspended particles is greater than 20 nm. Because the sizes of the particles were greater than the exaction Bohr radius, quantum confinement effects that result in the blue shifting of the fluorescence peak was not observed. However, fluorescence at the bulk bandedge energies were observed and had a FWHM of 50-60 nm.

CdS colloids exhibiting quantum confinement effects (blue shifted maxima in the absorption spectra) were being prepared since 1984. (Fotjik A., Henglein A., *Ber. Bunsenges. Phys. Chem.*, 88, (1984); Fischer C., Fotjik A., Henglein A., *Ber. Bunsenges. Phys. Chem.*, (1986)). In 1987, Spanhel and Henglein prepared CdS colloids having mean particle diameters between 4 and 6 nm. (Spanhel L., Henglein A., *Photochemistry of Colloidal Semiconductors, Surface Modification and Stability of Strong Luminescing CdS Particles, Am. Chem. Soc.*, 109 (1987)). The colloids demonstrated quantum confinement effects including the observation of size dependent absorption maxima (first exciton peaks) as well as size dependent fluorescent spectra. The colloids were prepared by bubbling a sulphur containing gas ($H_2S$) through an alkaline solution containing dissolved cadmium ions. The size and resultant color (of the fluorescence) of the resultant nanocrystals were dependent upon the pH of the solution. The colloids were further modified or "activated" by the addition of cadmium hydroxide to the solution that coated the suspended nanocrystals. The resultant core-shell nanocrystals demonstrated that the quantum yield of the photoluminescence was increased from under 1% to well over 50% with a FWHM of the photoluminescent spectra under 50 nm for some of the preparations.

Kortan and Brus developed a method for creating CdSe coated zinc sulphide (ZnS) nanocrystals and the opposite, zinc sulphide coated cadmium selenide nanocrystals. (Kortan R., Brus L., *Nucleation and Growth of CdSe on ZnS Quantum Crystallite Seeds, and Vice Versa, in Inverse Micelle Media, J. Am. Chem. Soc.*, 112 (1990)). The preparation grew ZnS on CdSe "seeds" using a organometallic precursor-based reverse micelle technique and kept them in solution via an organic capping layer (thiol phenol). The CdSe core nanocrystals had diameters between 3.5 and 4 nm and demonstrated quantum confinement effects including observable exciton absorption peaks and blue shifted photoluminescence. Using another preparation, CdSe cores were coated by a 0.4 nm layer of ZnS. The photoluminescence spectra of the resultant core-shell nanocrystals indicates a peak fluorescence at 530 nm with an approximate 40-45 nm FWHM.

Murray and Bawendi developed an organometallic preparation capable of making CdSe, CdS, and CdTe nanocrystals. (Murray C., Norris D., Bawendi M., *Synthesis and Characterization of Nearly Monodisperse CdE (E=S, Se, Te) Semiconductor Nanocrystallites, J. Am. Chem. Soc.*, 115, (1993)). This work, based on the earlier works of Brus, Henglein, Peyghambarian, allowed for the growth of nanocrystals having a diameter between 1.2 nm and 11.5 nm and with a narrow size distribution (<5%). The synthesis involved a homogeneous nucleation step followed by a growth step. The nucleation step is initiated by the injection of an organometallic cadmium precursor (dimethyl cadmium) with a selenium precursor (TOPSe-TriOctylPhosphine Selenium) into a heated bath containing coordinating ligands (TOPO-TriOctylPhosphineOxide). The precursors disassociate in the solvent, causing the cadmium and selenium to combine to form a growing nanocrystal. The TOPO coordinates with the nanocrystal to moderate and control the growth. The resultant nanocrystal solution showed an approximate 10% size distribution, however, by titrating the solution with methanol the larger nanocrystals could be selectively precipitated from the solution thereby reducing the overall size distribution. After size selective precipitation, the resultant nanocrystals in solution were monodisperse (capable of reaching a 5% size distribution) but were slightly prolate (i.e. nonspherical having an aspect ratio between 1.1 and 1.3). The photoluminescence spectra show a FWHM of approximately 30-35 nm and a quantum yield of approximately 9.6%.

Katari and Alivisatos slightly modified the Murray preparation to make CdSe nanocrystals. (Katari J., Alivisatos A., *X-ray Photoelectron Spectroscopy of CdSe Nanocrystals with Applications to Studies of the Nanocrystal Surface, J. Phys. Chem.*, 98 (1994)). They found that by substituting the selenium precursor TOPSe with TBPSe (TriButylPhosphineSelenide), nanocrystals were produced that were monodisperse without size selective precipitation, were crystalline, and spherical. The nanocrystals were size tunable from 1.8 nm to 6.7 nm in diameter and had an exciton peak position ranging from 1.9-2.5 eV (corresponding to 635-496 nm wavelength). Like the Murray paper, TOPO was used as the coordinating ligand.

Hines and Guyot-Sionest developed a method for synthesizing a ZnS shell around a CdSe core nanocrystal. (Hines et al., "Synthesis and Characterization of strongly Luminescing ZnS capped CdSe Nanocrystals"; J. Phys. Chem., 100:468-471 (1996)). The CdSe cores, having a monodisperse distribution between 2.7 nm and 3.0 nm (i.e. 5% size distribution with average nanocrystal diameter being 2.85 nm), were produced using the Katari and Alivisatos variation of the Murray synthesis. The photoluminescence spectra of the core shows a FWHM of approximately 30 nm with a peak at approximately 540 mn. The core CdSe nanocrystals were separated, purified, and resuspended in a TOPO solvent. The solution was heated and injected with zinc and sulphur precursors (dimethyl zinc and $(TMS)_2S$) to form a ZnS shell around the CdSe cores. The resultant shells were 0.6±0.3 nm thick, corresponding to 1-3 monolayers. The photoluminescence of the core-shell nanocrystals had a peak at 545 nm, FWHM of 40 nm, and a quantum yield of 50%.

A problem associated with the above attempts at making semiconductor nanocrystals is a marked decrease in the fluorescence quantum yield over time due to oxidation of the nanocrystal. An additional problem associated with attempts to synthesize semiconductor nanocrystal complexes is the presence of lattice mismatch between a core semiconductor layer and the semiconductor shell. The presence of lattice mismatch reduces the quantum efficiency of a given semiconductor nanocrystal complex due to its effects on recombination. Ideally, a core nanocrystal and a semiconductor nanocrystal shell would have as little lattice mismatch as possible to increase the quantum efficiency of the nanocrystal complex.

Therefore, a need exists in the art for a semiconductor nanocrystal complex that reduces oxidation of the nanocrystal. A need also exists for a semiconductor nanocrystal complex that prevents or reduced lattice mismatch between the semiconductor core and semiconductor shell.

SUMMARY OF THE INVENTION

In an embodiment, the present invention provides a semiconductor nanocrystal complex comprising a semiconductor nanocrystal core having an outer surface and a metal layer formed on the outer surface of the semiconductor nanocrystal core after synthesis of the semiconductor nanocrystal core. In an alternative embodiment, the semiconductor nanocrystal complex further comprises a shell overcoating the metal layer formed on the outer surface of the semiconductor nanocrystal core. Preferably, the shell comprises a semiconductor material having a bulk bandgap greater than that of semiconductor nanocrystal core.

In another embodiment, the present invention provides a method of making a semiconductor nanocrystal complex comprising synthesizing a semiconductor nanocrystal core having an outer surface and forming a metal layer on the outer surface of the semiconductor nanocrystal core after the synthesis of the semiconductor nanocrystal core. The method may further comprise overcoating the metal layer with a shell comprising a semiconductor material that preferably has a bulk bandgap greater than that of the semiconductor nanocrystal core.

DETAILED DESCRIPTION OF THE INVENTION

Figure 1:
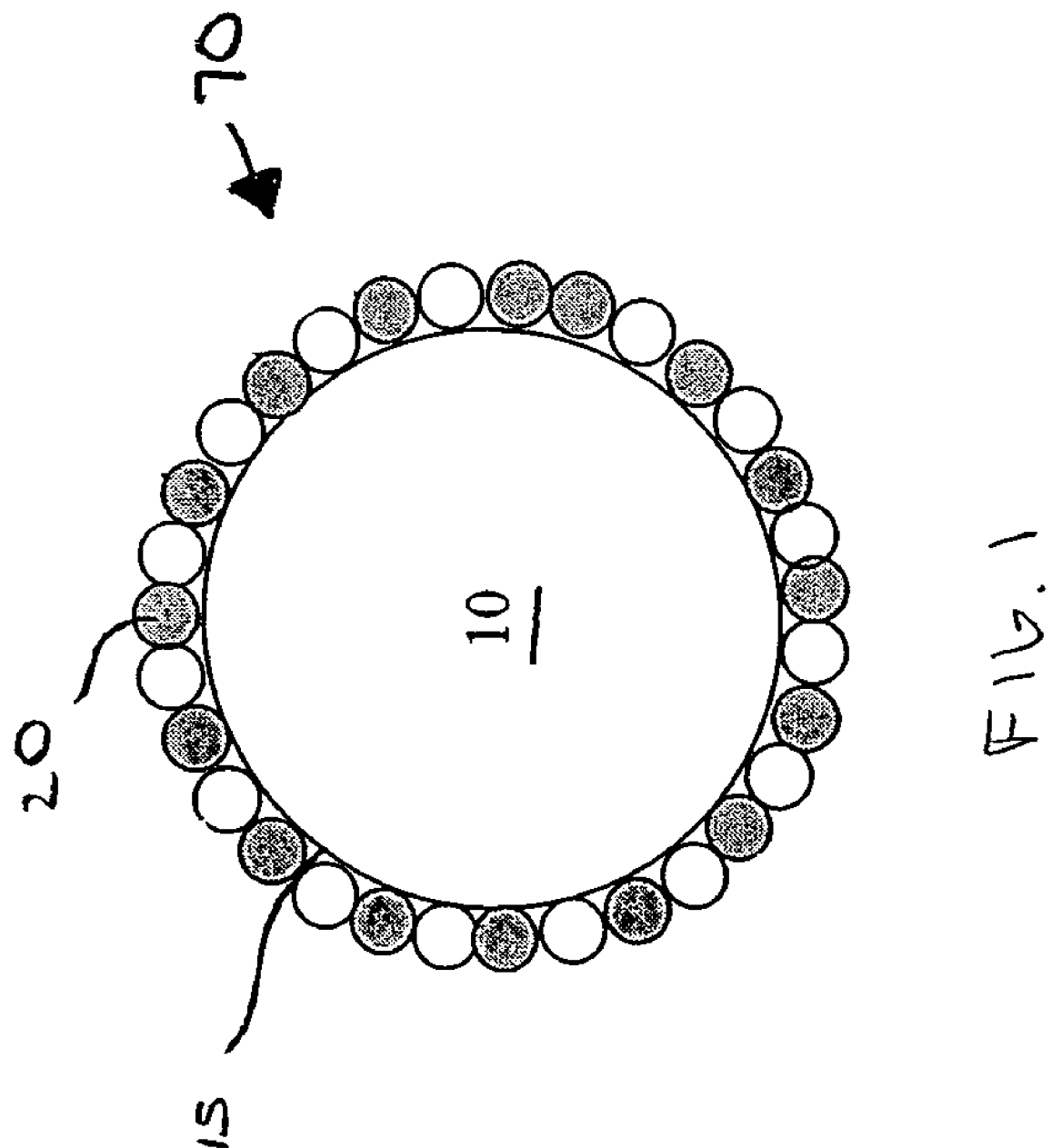
FIG. 1 is a schematic illustration of a nanocrystal complex according to an embodiment of the present invention.

Referring to FIG. 1, in an embodiment, the present invention provides a nanocrystal complex 70 comprising a semiconductor nanocrystal core 10 (also known as a semiconductor nanoparticle or semiconductor quantum dot) having an outer surface 15. Semiconductor nanocrystal core 10 may be spherical nanoscale crystalline materials (although oblate and oblique spheroids can be grown as well as rods and other shapes) having a diameter of less than the Bohr radius for a given material and typically but not exclusively comprising II-VI, III-V, and/or IV-VI binary semiconductors. Non-limiting examples of semiconductor materials comprising core 10 include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials).

According to the present invention, one or more metals 20 are formed on outer surface 15 of semiconductor nanocrystal core 10 (referred to herein as "metal layer" 20). Metal layer 20 may act to passivate outer surface 15 of semiconductor nanocrystal core 10 and limit the diffusion rate of oxygen molecules to semiconductor nanocrystal core 10. According to the present invention, metal layer 20 is formed on outer surface 15 after synthesis of semiconductor nanocrystal core 10 (as opposed to being formed on outer surface 15 concurrently during synthesis of semiconductor nanocrystal core 10). Metal layer 20 may include any number, type, combination, and arrangement of metals. For example, metal layer 20 may be simply a monolayer of metals formed on outer surface 15 or multiple layers of metals formed on outer surface 15. Metal layer 20 may also include different types of metals arranged, for example, in alternating fashion. Further, metal layer 20 may encapsulate semiconductor nanocrystal core 10 as shown in FIG. 1 or may be formed on only parts of outer surface 15 of semiconductor nanocrystal core 10. Metal layer 20 may include the metal from which the semiconductor nanocrystal core is made either alone or in addition to another metal. Non-limiting examples of metals that may be used as part of metal layer 20 include Cd, Zn, Hg, Pb, Al, Ga, or In. In an exemplary embodiment, the metals in metal layer 20 are zinc and cadmium.

Semiconductor nanocrystal core 10 and metal layer 20 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

Figure 2:
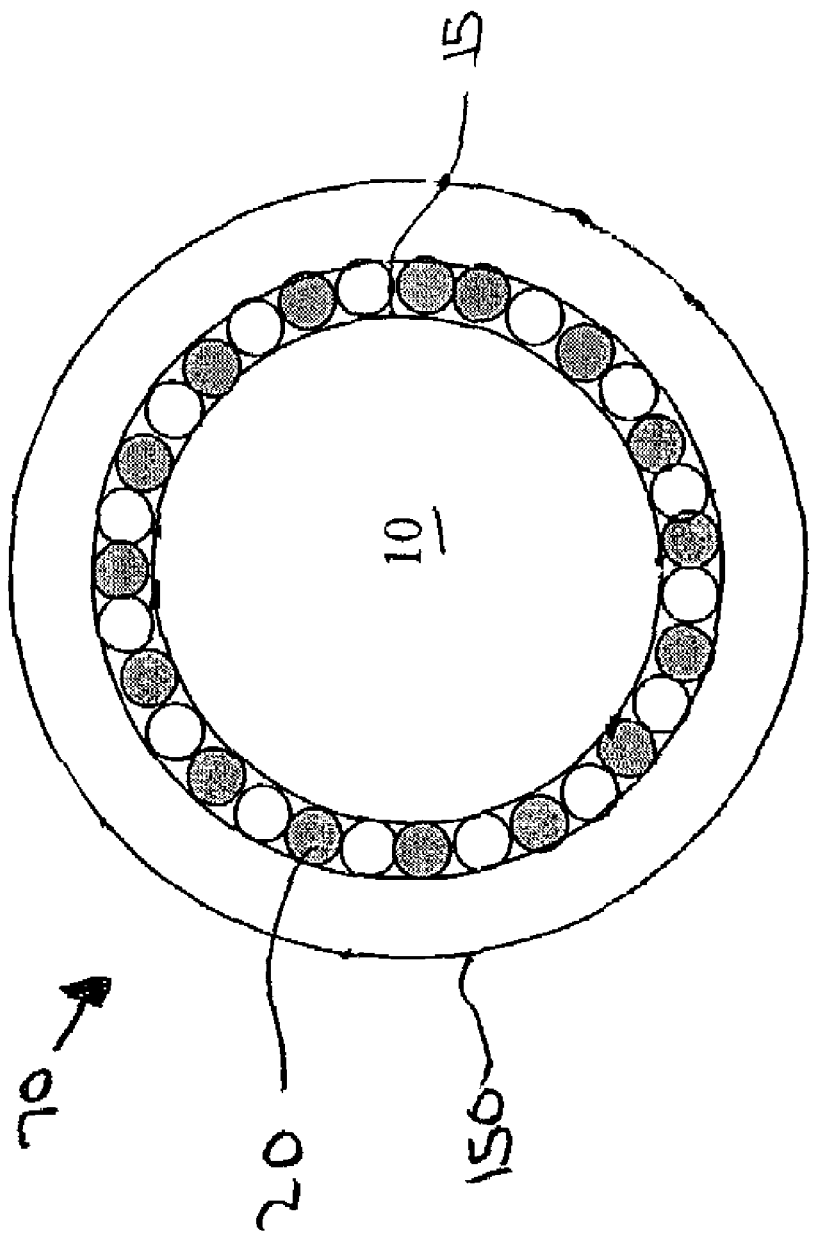
FIG. 2 is a schematic illustration of a nanocrystal complex according to another embodiment of the present invention.

Referring to FIG. 2, in an alternative embodiment, the present invention provides a nanocrystal complex 70 further comprising a shell 150 overcoating metal layer 20. Shell 150 may comprise a semiconductor material having a bulk bandgap greater than that of semiconductor nanocrystal core 10. In such an embodiment, metal layer 20 may act to passivate outer surface 15 of semiconductor nanocrystal core 10 as well as to prevent or decrease lattice mismatch between semiconductor nanocrystal core 10 and shell 150.

Shell 150 may be grown around metal layer 20 and is typically between 0.1 nm and 10 nm thick. Shell 150 may provide for a type A semiconductor nanocrystal complex 70. Shell 150 may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, or PbTe.

One example of shell 150 that may be used to passivate outer surface 15 of semiconductor nanocrystal core 10 is ZnS. In this case, the lattice mismatch between the ZnS shell and a semiconductor nanocrystal core of CdTe, for example, would be approximately 20%. The lattice mismatch between the ZnS shell and metal layer 20 would be significantly less. Thus, the presence of metal layer 20 would provide for a more complete and uniform shell 150 without the amount of defects that would be present with a greater lattice mismatch. Such a result may improve the quantum yield of resulting nanocrystal complex 70.

Semiconductor nanocrystal core 10, metal layer 20, and shell 150 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

Figure 3:
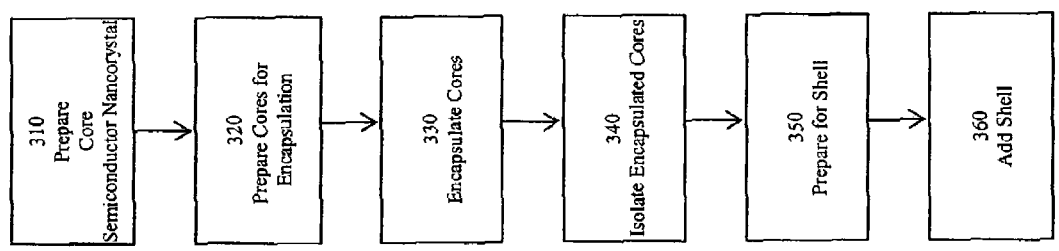
FIG. 3 is a flow chart illustrating a method of making a nanocrystal complex according to the present invention.

FIG. 3 provides an exemplary method of making a nanocrystal complex of the present invention. Although the exemplary method will be described with respect to the preparation of a CdTe semiconductor nanocrystal core, a metal layer of Cd and Zn and a ZnS shell, it will be appreciated that other types and combinations of semiconductor cores, metal layers, and semiconductor shells may be used.

In step 310, a semiconductor nanocrystal core is prepared. There are numerous ways to prepare semiconductor nanocrystal cores some of which have been described above. One known method of preparing a semiconductor nanocrystal core involves CdTe in TOPO. In order to isolate the semiconductor nanocrystals cores from the TOPO solution, methanol and toluene can be added to the solution, as semiconductor nanocrystal cores prepared in TOPO are insoluble in methanol and soluble in toluene. Enough methanol should be added to precipitate out the semiconductor nanocrystal cores and enough toluene should be added to ensure not to precipitate any of the radical complexes created during the preparation of the semiconductor nanocrystal cores. Roughly, a 5:1 ratio of methanol to toluene can accomplish this objective, although it will be appreciated that many other ratios may work just as well. The result of washing the semiconductor nanocrystal cores in methanol and toluene results in semiconductor nanocrystals cores precipitating out of solution.

In step 320, the semiconductor nanocrystals cores are prepared for encapsulation by the metal layer (or otherwise formation of the metal layer on the outer surface of the semiconductor nanocrystal core). This step entails determining the amount of encapsulating material that will be needed in step 330. This amount can be determined by reference to W. Willium Yu, Lianhua Qu, Wenzhou Guo, Xiaogang Peng, Chem. Mater. 2003, 15, 2854-2860, which is herein incorporated by reference. Generally, the amount of encapsulating material will depend on the amount of semiconductor nanocrystal cores in solution and the diameter of the semiconductor nanocrystal cores. Once the amount of semiconductor core and its diameter is determined, the metal layer can be added. The semiconductor nanocrystals cores can first be dissolved in toluene and the resulting solution added to a purified TOPO solution (such a purified TOPO solution can be prepared by heating technical grade TOPO to approximately 190° C., for example, and then cooling the TOPO solution to a temperature of 50-80° C., for example). The resulting semiconductor nanocrystal solution can then be heated to evaporate the toluene from the solution. Heating the solution to between 130-150° C. is preferable for this reaction. In step 330, the metal layer is added to the semiconductor nanocrystal core. Diethylzinc ($ET_2Zn$) in TOP and cadmium acetate dissolved in methanol, for example, can be used as precursors to create the metal layer. Although the formation of the metal layer is described with diethylzinc and cadmium acetate as the precursors for the formation of the metal layer, it is appreciated that many other precursors may be used. For example, zinc acetate, zinc oxalate, zinc stearate, zinc oxide, cadmium oxide, or cadmium carbonate can be used as precursors for the preparation of a metal layer of Zn and Cd. It is appreciated that many other precursors exist and may be used for the preparation of a metal layer comprising metals other than Zn and Cd.

In the exemplary semiconductor complex method described, the diethylzinc and cadmium acetate solutions can be used in a one to one ratio. Preferably, the amount of solutions to add should be significantly more than the amount necessary to bind to the outer surface of the semiconductor nanocrystal cores determined in step 320. For example, preferably between 10-50 times the amount necessary to bind to the outer surface of the semiconductor nanocrystal cores in solution is used.

Once the solutions of diethylzinc and cadmium acetate are prepared, they are be added to the semiconductor nanocrystal core solution, simultaneously or sequentially, resulting in a solution of semiconductor nanocrystal cores, purified technical grade TOPO, diethylzinc, and cadmium acetate. This resulting solution can then be heated to a temperature of between 190-200° C., for example, and remain heated until the metal layer is formed on the semiconductor nanocrystal core. A reaction time of between one-half and one hour is typically sufficient for the formation of the metal layer. Next, the solution can be cooled to 50-70° C., for example. The resulting mixture includes semiconductor nanocrystal cores with a metal layer in TOPO.

In step 340, the semiconductor nanocrystal cores with the metal layer are isolated. First, they can be drawn out of solution using the technique described in step 310. Specifically, methanol and toluene can be added to the solution in amounts that make the nanocrystal complex, in this case the semiconductor nanocrystal core and the metal layer, insoluble. The complexes will precipitate out of the solution resulting in a semiconductor nanocrystal complex comprising a semiconductor nanocrystal core having an outer surface and a metal layer formed on the outer surface.

Alternatively, once the complexes comprising the semiconductor nanocrystal core and the metal layer are drawn out of the solution, a shell can be added using known shelling techniques. Such an alternative embodiment involves step 350—preparing the semiconductor nanocrystal core with metal layer formed thereon for shelling. In one exemplary embodiment, ZnS is grown on the core semiconductor nanocrystal with a metal layer. Initially, the isolated nanocrystal core of CdTe and the metal layer can be dissolved in toluene and the resulting solution is introduced into a TOPO solution. The TOPO can be technical grade TOPO that has been purified using the technique described in step 320. The toluene can then be removed leaving a solution of CdTe core nanocrystals with a metal layer of Cd and Zn.

In step 360, the shell is added to the semiconductor nanocrystal core having a metal layer thereon. To form the shell, two precursor solutions can be added to the solution of the semiconductor nanocrystal core with metal layer thereon. The first solution can be diethylzinc in TOP, the second solution can be (TMS)$_2$S in TOP. Enough of the solutions is added to allow ZnS to shell the surface of the semiconductor nanocrystal core with metal layer thereon. After the solutions are added, the temperature can be raised to 190-200° C., for example, and the reaction allowed to take place. One-half to one hour is typically enough time for the reaction to take place, however, it is appreciated that more or less time may be needed depending on the temperature and the amount of nanocrystal cores with metal layer thereon being shelled.

Once the shell is grown, the solution can be cooled to approximately 50° C., for example, and the final nanocrystal complexes precipitated out of solution. All the above described steps may take place under nitrogen to improve the quantum yield of the resulting nanocrystal complex. The resulting nanocrystal complexes are more resistant to oxidation and have an increased quantum yield over semiconductor nanocrystals of CdTe made by known techniques.

The above-described technique is only exemplary and other modifications may be made that result in semiconductor nanocrystal complexes according to the present invention.

EXAMPLE

Preparing a Semiconductor Nanocrystal Complex

The present examples discloses how to make a semiconductor nanocrystal complex comprising a semiconductor nanocrystal core, a metal layer formed on the semiconductor nanocrystal core after synthesis of the semiconductor nanocrystal core and a semiconductor shell overcoating the metal layer.

20 grams of technical grade TOPO was loaded into each of two 100 ml reaction flasks. After the flasks were purged for 5 minute by nitrogen, the reaction flasks were heated to 130° C. using heating mantles. The system was switched to a vacuum system to purify the solvent (technical grade TOPO). After 10 minutes at 130° C. purification, the temperature was increased to 190° C. for further purification for one to two hours. Next, the reaction flasks containing the purified TOPO was cooled down to 70° C. and filled with nitrogen. In reaction flask 1, one of the 100 ml reaction flasks, 2 ml purified CdTe core dots in toluene (30 mg/ml) was introduced by syringe, and the low boiling point solvent (toluene) was removed by vacuum.

Reaction flask 1 was then filled with nitrogen and the temperature was increased to 130° C. In preparation for the growth of a metal layer and the shell, the following solutions were then prepared:

Solution 1—0.4 gram cadmium acetate dihydrate was sealed in a 8 ml vial by rubber septum and purged by nitrogen for 10 minutes, then 3 ml nitrogen purged methanol was added to dissolve the cadmium acetate dihydrate.

Solution 2. 0.2 gram diethyl zinc was mixed with 3 gram TOP and sealed by rubber septum.

Solution 3. 0.2 gram diethyl zinc was mixed with 4 gram TOP and sealed by rubber septum.

Solution 4. 0.25 gram hexamethylsisilathiane was mixed with 4 gram TOP and sealed by rubber septum.

After preparation, all the solutions were stored in a refrigerator.

Solution 1 and solution 2 were loaded into two 5 ml syringes (nitrogen purged) separately and were slowly injected into reaction flask 1 at 130° C. by syringe pump(0.05 ml/min). After solutions 1 and 2 were injected, the resulting solution was kept at 130° C. for 30 minutes. The temperature was next increased to 190° C. for another 30 minutes. The resulting solution was cooled down to 50° C. Aliquots were taken out periodically during this step for the purpose of monitoring reaction.

10 ml toluene and 40 ml methanol (nitrogen purged) were added into reaction flask 1 to precipitate the nanocrystals formed. The resulted mixture was transferred into rubber septum sealed centrifuge tube (nitrogen purged) and was centrifuged for 5 minutes at 4000 rpm. The supernatant was drawn off by syringe and the solid was dissolved into 5 ml nitrogen purged toluene and centrifuged for 10 minutes at 4000 rpm.

The clear supernatant nanocrystal solution was transferred into the purified TOPO solvent in reaction flask 2 and the toluene was pumped off at 70° C. Reaction flask 2 was heated to 130° C. for the preparation of a ZnS shell layer procedure. Solution 3 and solution 4, described above, were loaded into two nitrogen purged syringes separately and slowly injected into reaction flask 2 by syringe pump at 0.05 ml/min. After injection, the temperature was kept at 130° C. for 30 minutes. The solution was then heated to 170° C. for another 30 minutes. Finally, the solution was allowed to cool down to 50° C. Precipitation and centrifugation steps were used to collect the nanocrystal complexes and the collected nanocrystal complexes were dissolved into toluene and stored in nitrogen.

The foregoing description and example have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

We claim:

1. A semiconductor nanocrystal complex comprising: a semiconductor nanocrystal core having an outer surface and having a diameter between 1 nanometers and 20 nanometers; and a metal layer formed on the outer surface of the semiconductor nanocrystal core after synthesis of the semiconductor nanocrystal core, wherein no linking molecules are used to attach the metal layer to the core.

2. The semiconductor nanocrystal complex of claim 1, further comprising a shell comprising a semiconductor material overcoating the metal layer.

3. The semiconductor nanocrystal complex of claim 2, wherein the semiconductor material of the shell has a bulk bandgap greater than that of the semiconductor nanocrystal core.

4. The semiconductor nanocrystal complex of claim 2, wherein the metal layer reduces lattice mismatch between the semiconductor nanocrystal core and the shell.

5. The semiconductor nanocrystal complex of claim 2, wherein the metal layer limits the diffusion rate of oxygen molecules to the semiconductor nanocrystal core.

6. The semiconductor nanocrystal complex of claim 2, wherein the semiconductor nanocrystal core comprises CdTe and the shell comprises ZnS.

7. The semiconductor nanocrystal complex of claim 2, wherein the nanocrystal complex comprises CdTe, the shell comprises ZnS, and the metal layer comprises Zn and Cd.

8. The semiconductor nanocrystal complex of claim 1, wherein the metal layer comprises at least two metals.

9. The semiconductor nanocrystal complex of claim 8, wherein the at least two metals is two metals arranged in an alternating pattern.

10. The semiconductor nanocrystal complex of claim 1, wherein the metal layer limits the diffusion rate of oxygen molecules to the semiconductor nanocrystal core.

11. The semiconductor nanocrystal complex of claim 1, wherein the metal layer includes a metal of the semiconductor nanocrystal core.

12. The semiconductor nanocrystal complex of claim 1, wherein the semiconductor nanocrystal core comprises CdTe.

13. A method of making a semiconductor nanocrystal complex comprising: synthesizing a semiconductor nanocrystal core having an outer surface and having a diameter between 1 nanometers and 20 nanometers; and forming a metal layer on the outer surface of the semiconductor nanocrystal core after synthesis of the semiconductor nanocrystal core, wherein no linking molecules are used to attach the metal layer to the core.

14. The method of claim 13, further comprising overcoating the metal layer with a shell comprising a semiconductor material.

15. The method of claim 14, wherein the semiconductor material of the shell has a bulk bandgap greater than that of the semiconductor nanocrystal core.

16. The method of claim 14, wherein the metal layer reduces lattice mismatch between the semiconductor nanocrystal core and the shell.

17. The method of claim 14, wherein the metal layer limits the diffusion rate of oxygen molecules to the semiconductor nanocrystal core.

18. The method of claim 14, wherein the semiconductor nanocrystal complex comprises CdTe, the shell comprises ZnS, and the metal layer comprises Zn and Cd.

19. The method of claim 13 wherein the metal layer comprises at least two metals.

20. The method of claim 19, wherein the at least two metals is two metals arranged in an alternating pattern.

21. The method of claim 13, wherein the metal layer limits the diffusion rate of oxygen molecules to the semiconductor nanocrystal core.

22. The method of claim 13, wherein the metal layer includes a metal of the semiconductor nanocrystal core.

23. The method of claim 13, wherein the semiconductor nanocrystal core comprises CdTe and the metal layer comprises Zn and Cd.

24. A semiconductor nanocrystal complex made according to the method of claim 13.

* * * * *